(12) United States Patent
Hirooka et al.

(10) Patent No.: US 10,236,634 B2
(45) Date of Patent: Mar. 19, 2019

(54) ELECTROMAGNETIC SHIELD MEMBER AND ELECTROMAGNETIC SHIELD MEMBER-EQUIPPED WIRING DEVICE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Toshiya Hirooka, Mie (JP); Kouji Fukumoto, Mie (JP); Daisuke Hashimoto, Mie (JP); Jisung Kim, Mie (JP)

(73) Assignees: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 0 days.

(21) Appl. No.: 15/739,473

(22) PCT Filed: Jun. 22, 2016

(86) PCT No.: PCT/JP2016/068510
§ 371 (c)(1),
(2) Date: Dec. 22, 2017

(87) PCT Pub. No.: WO2017/010248
PCT Pub. Date: Jan. 19, 2017

(65) Prior Publication Data
US 2018/0219327 A1    Aug. 2, 2018

(30) Foreign Application Priority Data

Jul. 10, 2015   (JP) .................. 2015-138693

(51) Int. Cl.
*H01J 5/50* (2006.01)
*H01R 13/648* (2006.01)
(Continued)

(52) U.S. Cl.
CPC .......... *H01R 13/648* (2013.01); *H01R 9/032* (2013.01); *H01R 13/6581* (2013.01); *H02G 15/08* (2013.01); *H05K 9/0098* (2013.01)

(58) Field of Classification Search
CPC ....... H01R 13/648; H01R 9/032; H02G 15/08
(Continued)

(56) References Cited

U.S. PATENT DOCUMENTS

| 6,583,352 B2 * | 6/2003 | Fukushima | ............ H01R 9/032 174/373 |
| 7,354,297 B2 * | 4/2008 | Tsukashima | ......... H01R 13/595 439/368 |

(Continued)

FOREIGN PATENT DOCUMENTS

JP    2003179381 A    6/2003

OTHER PUBLICATIONS

International Search Report for Application No. PCT/JP2016/068510 dated Sep. 13, 2016; 6 pages.

*Primary Examiner* — Abdullah A Riyami
*Assistant Examiner* — Nelson R. Burgos-Guntin
(74) *Attorney, Agent, or Firm* — Reising Ethington, P.C.

(57) ABSTRACT

An electromagnetic shield member is for shielding a wiring member (e.g., an electrical wire) and a connection portion at an end portion of the wiring member (e.g., a first connection portion), and the electromagnetic shield member includes a wiring electromagnetic shield portion that electromagnetically shields the wiring member, and a connection portion electromagnetic shield cover that is formed by a metal plate member and electromagnetically shields the connection por- (Continued)

tion at the end portion of the wiring member. The connection portion electromagnetic shield cover includes a cover main body portion that covers the connection portion at the end portion of the wiring member, and a fixing piece that sandwiches and fixes a first-end edge portion of the wiring electromagnetic shield portion by extending from the cover main body portion and being bent so as to fold back.

7 Claims, 7 Drawing Sheets

(51) Int. Cl.
    *H01R 9/03* (2006.01)
    *H02G 15/08* (2006.01)
    *H05K 9/00* (2006.01)
    *H01R 13/6581* (2011.01)

(58) Field of Classification Search
    USPC ...... 439/607.02, 98, 607.41, 607.42, 607.48, 439/607.5
    See application file for complete search history.

(56) References Cited

U.S. PATENT DOCUMENTS

| | | | |
|---|---|---|---|
| 2002/0002004 A1* | 1/2002 | Akama | H01R 12/62 439/625 |
| 2003/0049956 A1* | 3/2003 | Yoshida | H01R 9/0518 439/98 |
| 2004/0166723 A1* | 8/2004 | Kumamoto | H01R 13/562 439/470 |
| 2006/0099851 A1* | 5/2006 | Duarte | H01R 13/567 439/502 |
| 2009/0093159 A1 | 4/2009 | Aoki et al. | |
| 2009/0239420 A1* | 9/2009 | Nishio | G02B 6/4201 439/656 |
| 2009/0280688 A1* | 11/2009 | Kawada | H01Q 1/1271 439/620.01 |
| 2010/0184327 A1* | 7/2010 | Carpenter | H01R 13/512 439/607.01 |
| 2011/0318960 A1* | 12/2011 | Koga | H01R 4/185 439/585 |
| 2014/0023835 A1 | 1/2014 | Freimann et al. | |
| 2014/0113489 A1* | 4/2014 | Tanaka | H01R 13/6592 439/607.53 |
| 2014/0357108 A1* | 12/2014 | Aoki | H01R 12/772 439/329 |
| 2015/0357748 A1* | 12/2015 | Ohmori | H01R 24/52 439/578 |
| 2016/0072210 A1* | 3/2016 | Armstrong | F02C 7/00 439/67 |
| 2016/0156116 A1* | 6/2016 | Kurachi | H01R 12/62 439/78 |
| 2016/0380390 A1* | 12/2016 | Kusamaki | H01R 9/034 439/607.44 |
| 2018/0019549 A1* | 1/2018 | Makido | H01R 13/6582 |
| 2018/0123265 A1* | 5/2018 | Hirooka | H01R 4/60 |

\* cited by examiner

ELECTROMAGNETIC SHIELD MEMBER AND ELECTROMAGNETIC SHIELD MEMBER-EQUIPPED WIRING DEVICE

CROSS REFERENCE TO RELATED APPLICATIONS

This application claims the priority of Japanese patent application JP2015-138693 filed on Jul. 10, 2015, the entire contents of which are incorporated herein.

TECHNICAL FIELD

This invention relates to technology for electromagnetically shielding a wiring device for connecting electrical devices to each other in a vehicle or the like.

BACKGROUND ART

Patent Document 1 (JP 2014-56851A) discloses an electromagnetic shield tool that includes a metallic cloth and two brackets by which a first outer edge portion of the metallic cloth and a second outer edge portion on the side opposite to the first outer edge portion are respectively held in an annular shape. Electrical wires are arranged extending through the metallic cloth that is held in an annular shape. Also, the brackets are fixed to the casings of electrical devices to which the electrical wires are connected.

SUMMARY

However, the electromagnetic shield tool disclosed in Patent Document 1 is for electromagnetically shielding mainly electrical wires. For this reason, a different electromagnetic shield component is needed in order to electromagnetically shield terminals at end portions of the electrical wires. Accordingly, there has been a problem in that the number of components increases.

In view of this, an object of the present design is to make it possible to electromagnetically shield a wiring member and a connection portion at an end portion thereof with the smallest number of components possible.

In order to solve the foregoing problem, a first aspect includes: a wiring electromagnetic shield portion that electromagnetically shields a wiring member; and a connection portion electromagnetic shield cover that is formed by a metal plate member and electromagnetically shields a connection portion of an end portion of the wiring member, wherein the connection portion electromagnetic shield cover includes a cover main body portion that covers the connection portion of the end portion of the wiring member, and a fixing piece that sandwiches and fixes a first-end edge portion of the wiring electromagnetic shield portion by extending from the cover main body portion and being bent so as to fold back.

A second aspect is the electromagnetic shield member according to the first aspect, wherein the fixing piece is folded back toward a side on which the wiring electromagnetic shield portion extends, at a folding line located at a boundary with the cover main body portion.

A third aspect is the electromagnetic shield member according to the first or second aspect, wherein the wiring electromagnetic shield portion is obtained by braiding metal strands.

A fourth aspect is the electromagnetic shield member according to the first or second aspect, wherein the wiring electromagnetic shield portion includes a portion in which a metal plate is folded into a bellows shape.

A fifth aspect includes: a wiring device that includes a wiring member, a first connection portion that is provided at a first end portion of the wiring member and is to be connected to a first electrical device, and a second connection portion that is provided at a second end portion of the wiring member and is to be connected to a second electrical device; and the electromagnetic shield member according to any one of the first to fourth aspects, the connection portion electromagnetic shield cover electromagnetically shielding the first connection portion.

A sixth aspect is the electromagnetic shield member-equipped wiring device according to the fifth aspect, wherein the first connection portion includes a first terminal provided at the first end portion of the wiring member, a first housing that forms a housing recessed portion in which the first terminal is housed, and a first cap that blocks the housing recessed portion, and the connection portion electromagnetic shield cover is to be attached to a casing of the first electrical device in a state of pressing the first cap.

A seventh aspect is the electromagnetic shield member-equipped wiring device according to the fifth or sixth aspect, including a plurality of the wiring members that are arranged in a parallel state, wherein the wiring electromagnetic shield portion is arranged on a first main surface side of the parallel state of the plurality of wiring members, the first connection portion is to be connected to the first electrical device on a second main surface side in the parallel state of the plurality of wiring members, the connection portion electromagnetic shield cover electromagnetically shields the first connection portion from the first main surface side in the parallel state of the plurality of wiring members, the second connection portion includes a second terminal provided at the second end portion of the wiring member, a second housing that forms a housing recessed portion in which the second terminal is housed, and a second cap that blocks the housing recessed portion of the second housing, and the second connection portion is to be connected to the second electrical device on the first main surface side in an arrangement state of the plurality of wiring members, and the electromagnetic shield member-equipped wiring device includes a bracket that is to be fixed to a casing of the second electrical device, the bracket including an electromagnetic shield member fixing portion fixed to an edge portion on a second end side of the wiring electromagnetic shield portion, and a cap pressing portion that extends from the electromagnetic shield member fixing portion toward the second cap while circumventing a side of the second connection portion and that presses the second cap.

According to the first aspect, an edge portion of the wiring electromagnetic shield portion is sandwiched and fixed by the fixing piece. For this reason, the edge portion of the wiring electromagnetic shield portion can be fixed by this connection portion electromagnetic shield cover. Accordingly, it is possible to electromagnetically shield a wiring member and a connection portion at an end portion thereof with the smallest number of components possible.

According to the second aspect, the wiring electromagnetic shield portion that is sandwiched and fixed between the fixing piece and the cover main body portion can electromagnetically shield the wiring member while extending without being folded back. For this reason, the wiring electromagnetic shield portion is not likely to become damaged.

According to the third aspect, the wiring electromagnetic shield portion is obtained by braiding metal strands, and thus bends easily.

According to the fourth embodiment, the wiring electromagnetic shield portion is a member in which a metal plate is folded into a bellows shape, and thus bends easily.

According to the fifth aspect, on the first connection portion side, the edge portion of the wiring electromagnetic shield portion is sandwiched and fixed between the fixing piece and the cover main body portion of the connection portion shield cover. For this reason, the edge portion of the wiring electromagnetic shield portion can be fixed by this connection portion shield cover. Accordingly, it is possible to electromagnetically shield a wiring member and a connection portion at an end portion thereof with the smallest number of components possible.

According to the sixth aspect, the shield cover can suppress detachment of the first cap that blocks the housing recessed portion of the first connection portion.

Assuming a configuration in which the wiring electromagnetic shield portion is arranged on the first main surface side in the parallel state of the wiring members, the first connection portion is connected to the first electrical device on the second main surface side in the parallel state of the wiring members, and the second connection portion is connected to the second electrical device on the first main surface side in the arrangement state of the wiring member, when envisioning a configuration in which the connection portion electromagnetic shield cover electromagnetically shields the first connection portion from the first main surface side in the parallel state of the wiring members, with a configuration similar to that of the connection portion electromagnetic shield cover on the second connection portion side, it is difficult to press the second cap of the second connection portion. In view of this, by employing the bracket that includes the electromagnetic shield member fixing portion fixed to the second-end edge portion, and the cap pressing portion that extends from the electromagnetic shield member fixing portion toward the second cap while circumventing a side of the second connection portion and that presses the second cap, the bracket being fixed to a casing of the second electrical device, as in the seventh aspect, it is possible to press the second cap with a smaller number of components.

DESCRIPTION OF EMBODIMENTS

Embodiment

Figure 1:
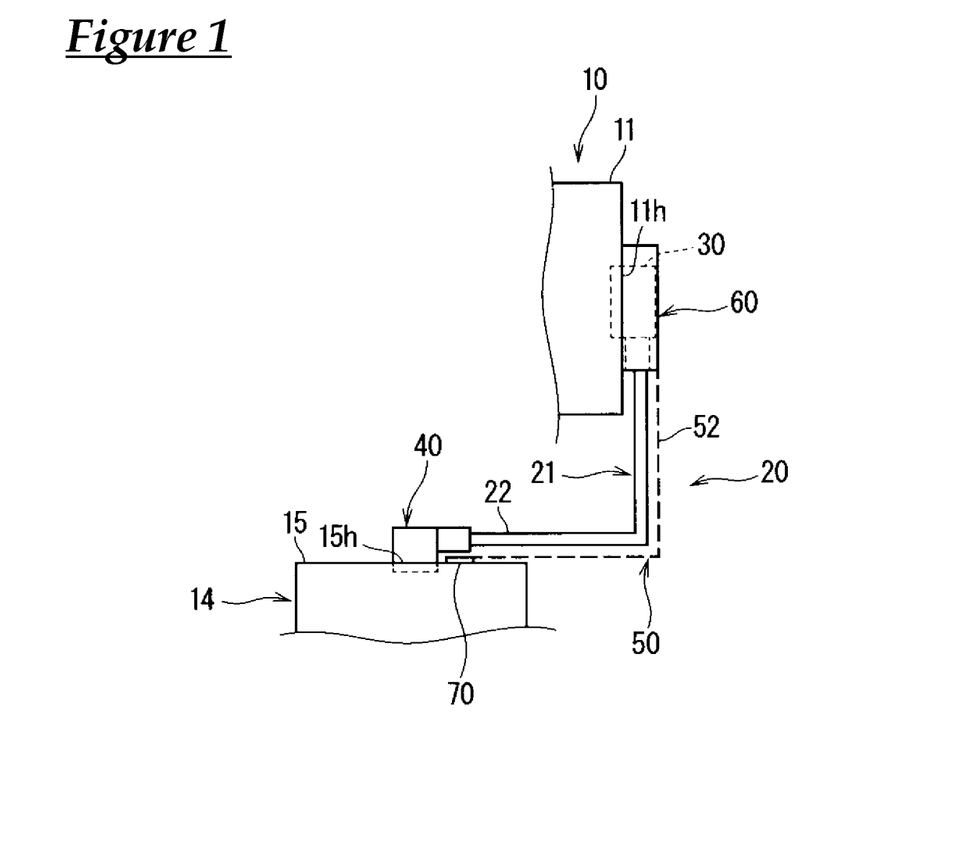
FIG. 1 is an illustrative diagram showing a state where an electromagnetic shield member-equipped wiring device according to an embodiment is used as wiring between two electrical devices.

Hereinafter, an electromagnetic shield member and an electromagnetic shield member-equipped wiring device according to an embodiment will be described. FIG. 1 is an illustrative diagram showing a state where an electromagnetic shield member-equipped wiring device 20 is used as wiring between two electrical devices 10 and 14 (first electrical device 10 and second electrical device 14).

Overall Configuration

The electromagnetic shield member-equipped wiring device 20 is used as wiring for electrically connecting two electrical devices 10 and 14 to each other in a vehicle or the like. Conceivable examples of combinations of the two electrical devices 10 and 14 include a motor for traveling driving and an inverter for driving that motor in an electric automobile, and an inverter for motor driving and a battery for supplying electrical power to that inverter. The following description envisions the case where the one electrical device 10 is a motor (e.g., a three-phase motor) and the other electrical device 14 is an inverter.

Figure 3:
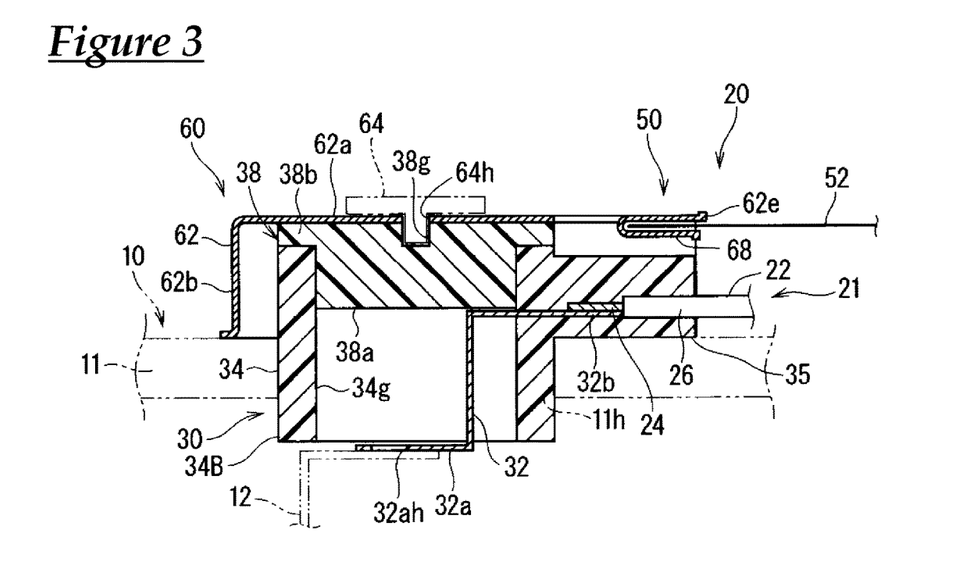
FIG. 3 is a cross-sectional view of the first end portion of the electromagnetic shield member-equipped wiring device.

The electrical device 10 includes a casing 11 for housing electrical elements (see FIG. 3). An opening 11h is formed in the casing 11. This electrical device 10 includes a wiring member 12 for electrical and mechanical connection to a first connection portion 30 that is provided on a first end portion side of the electromagnetic shield member-equipped wiring device 20. Here, a mechanical connection between two members refers to the state where two members are maintained in contact so as to not become separated. The same follows in the following description as well. The wiring member 12 is formed by a metal plate or the like. A metal plate that has been subjected to press work or the like (called a bus bar) can be used as the wiring member 12. The wiring member 12 is electrically connected to an electrical element (e.g., a motor coil winding) of the electrical device 10 inside the casing 11.

The electrical device 14 includes a casing 15 for housing electrical elements. An opening 15h is formed in the casing 15. This electrical device 14 includes a wiring member for electrical and mechanical connection to a second connection portion 40 that is provided on a second end portion side of the electromagnetic shield member-equipped wiring device 20. Similarly to the wiring member 12, this wiring member is formed by a metal plate or the like, and is electrically connected to an electrical component of the electrical device 14 inside the casing 15.

The electromagnetic shield member-equipped wiring device 20 is used as wiring between the electrical device 10 and the electrical device 14. This electromagnetic shield member-equipped wiring device 20 includes a wiring device 21 and an electromagnetic shield member 50.

The wiring device 21 includes electrical wires 22 that serve as the wiring member, a first connection portion 30, and a second connection portion 40. The electrical wires 22 are wiring members for electrically connecting the electrical device 10 and the electrical device 14, the first connection portion 30 is a portion that is provided on first end portions of the electrical wires 22 and is connected to the one electrical device 10, and the second connection portion 40 is a portion that is provided on second end portions of the electrical wires 22 and is connected to the other electrical device 14.

The electromagnetic shield member 50 includes a wiring electromagnetic shield portion 52 and a connection portion electromagnetic shield cover 60.

The wiring electromagnetic shield portion 52 is a member for electromagnetically shielding the electrical wires 22.

The connection portion electromagnetic shield cover 60 is a member for electromagnetically shielding the first connection portion 30 at the end portions of the electrical wires 22. Here, the connection portion electromagnetic shield cover 60 electromagnetically shields the first connection portion 30 at the first end portions of the electrical wires 22.

Figure 2:
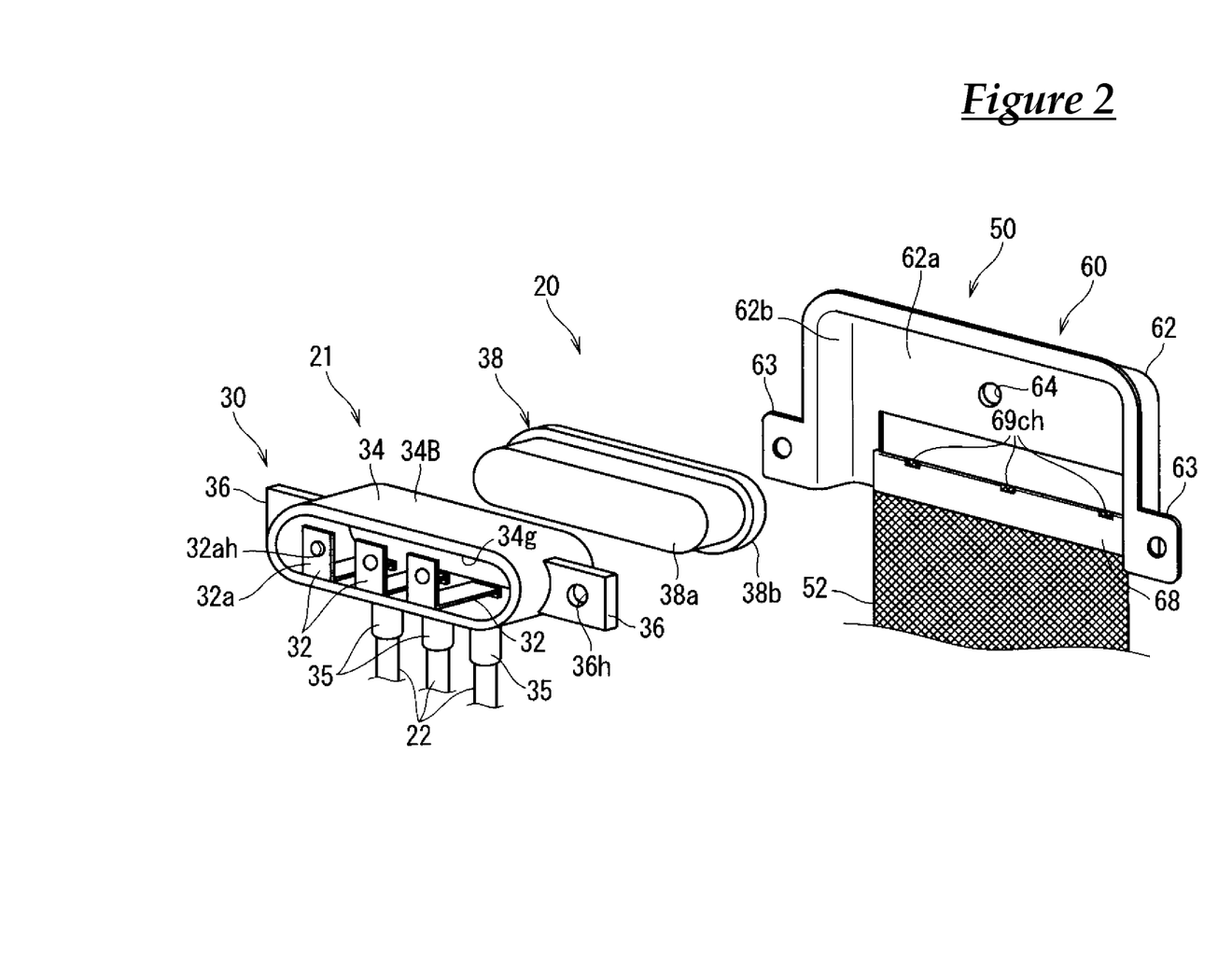
FIG. 2 is an exploded perspective view of a first end portion of the electromagnetic shield member-equipped wiring device.

Various portions will be described more specifically below. FIG. 2 is an exploded perspective view of the first end portion of the electromagnetic shield member-equipped wiring device 20, and FIG. 3 is a cross-sectional view of the first end portion of the electromagnetic shield member-equipped wiring device 20.

Wiring Device

As shown in FIGS. 1 to 3, the electrical wires 22 each include a conductive wire 24. Here, the electrical wire 22 is a sheathed electrical wire that includes the conductive wire 24 and a sheath portion 26. Here, the electrical device 10 is envisioned to be a three-phase motor, and three electrical wires 22 are used. It is sufficient to provide one or more electrical wires, and the number thereof is appropriately determined according to the preferred number of wires.

The conductive wire 24 is a wire-like member formed by a metal material made of copper, a copper alloy, aluminum, an aluminum alloy, or the like. The conductive wire 24 may be constituted by a group of strands, or may be constituted by a single strand. The lateral cross-sectional shape of the conductive wire 24 (shape of the cross-section orthogonal to the extending direction of the conductive wire 24) may describe a circular shape, or may describe a quadrangular shape.

The sheath portion 26 is an insulating portion that covers the outer circumference of the conductive wire 24. The sheath portion 26 can be formed by performing extrusion coating of resin around the conductive wire 24. The sheath portion 26 may also be formed by over-molding a flexible elastomer resin or the like on the conductive wire, laminating an insulating film or the like on the conductive wire, or heat-shrinking a heat shrink tube around the conductive wire.

The electrical wires 22 are arranged in a parallel state. More specifically, the electrical wires 22 are arranged so as to be side-by-side in a parallel state, and intermediate portions thereof are bent toward a first main surface side among the surfaces along which the electrical wires 22 extend.

The first connection portion 30 includes first terminals 32, a first housing 34, and a first cap 38.

The first terminals 32 are each formed by performing press work or the like on a metal plate member made of copper, a copper alloy, aluminum, an aluminum alloy, or the like. The number of first terminals 32 corresponds to the number of electrical wires 22. Here, three first terminals 32 are provided. A device connection portion 32a is provided on one end side of each of the first terminals 32, and an electrical wire connection portion 32b is provided on the other end side of each of the first terminals 32. Here, the first terminals 32 are each formed by a long and thin plate-shaped metal plate member, and two places in an intermediate portion with respect to the extending direction of the metal plate member are bent into an L shape in mutually opposite directions.

The device connection portion 32a is shaped as an elongated rectangle, and a hole 32ah is formed in an intermediate portion thereof. The device connection portion 32a and the wiring member 12 are electrically and mechanically connected by overlaying the device connection portion 32a and the wiring member 12 of the electrical device 10 on each other, inserting a screw through the hole 32ah of the device connection portion 32a and a hole in the wiring member 12, and then screwing a nut onto the screw. Alternatively, the electrical and mechanical connection of the device connection portion and the wiring member may be achieved using, for example, a fitting connection structure including a male terminal shape and a female terminal shape.

The electrical wire connection portion 32b is shaped as a long and thin plate. A portion of the conductive wire 24 that is exposed in the end portion of one of the electrical wires 22 is electrically and mechanically connected to the electrical wire connection portion 32b by ultrasonic welding, resistance welding, soldering, or the like. Alternatively, the connection of the electrical wire connection portion and the conductive wire in the end portion of the electrical wire may be achieved by crimping connection or the like.

The first housing 34 is a member that is formed by a resin or the like, and forms a housing recessed portion 34g that houses the device connection portions 32a when the first terminals 32 are held in a certain orientation. Here, the first housing 34 includes a housing main body portion 34B and electrical wire guide portions 35.

The housing main body portion 34B is shaped as an elongated cylinder (more specifically, is shaped as a cylinder having arc-shaped portions that connect the end portions of a pair of straight portions that are parallel to each other), and the housing recessed portion 34g is formed inside the housing main body portion 34B. Multiple electrical wire guide portions 35 protrude outward from one of the straight portions of the housing main body portion 34B.

The electrical wire connection portions 32b of the first terminals are held embedded in the portions where the electrical wire guide portions 35 are formed in the one straight portion of the housing main body portion 34B, and thus the electrical wire connection portions 32b are held in a parallel state with spaces therebetween.

In this state, the device connection portions 32a of the first terminals 32 protrude into the housing recessed portion 34g inside the housing main body portion 34B. Note that here, the device connection portions 32a extend in a direction orthogonal to the penetrating direction of the housing main body portion 34B, but this is not necessarily required, and the device connection portions 32a may extend along the penetrating direction of the housing main body portion 34B (see later-described first variation). Also, the electrical wires 22 pass through and extend out from the electrical wire guide portions 35.

Note that fixing pieces 36, which are for fixing to the casing 11 by screw fastening or the like, are provided on the outer circumferential portion of the housing main body portion 34B. The fixing pieces 36 may be resin portions that are integrally molded with the housing main body portion 34B, or may be metal plates or the like that are insert-molded into portions of the outer circumferential portion of the housing main body portion 34B. A screw insertion hole 36h is formed in each of the fixing pieces 36. The fixing pieces 36 come into contact with the outer surface of the casing 11 in the state where one end portion of the housing main body portion 34B is fitted into the opening 11h of the casing 11. In this state, screws are inserted into the screw insertion holes 36h and screwed to screw holes formed in the casing 11. Accordingly, the first connection portion 30 is fixed to the casing 11.

As described above, when one end portion of the housing main body portion 34B has been fitted into the opening 11h of the casing 11, the device connection portions 32a of the first terminals 32 and the wiring member 12 are overlaid on each other. In this state, the outward-facing opening of the housing main body portion 34B is used to carry out an operation of connecting the device connection portions 32a and the wiring member 12 using screws or the like.

The first cap 38 is formed of a resin or the like, and is a member for blocking the opening on the side opposite to the casing 11 in the housing recessed portion 34g of the housing main body portion 34B. More specifically, the first cap 38 includes a fitting portion 38a that is to be fitted into the housing recessed portion 34g, and a flange portion 38b that protrudes circumferentially outward from one end portion of the fitting portion 38a. When the fitting portion 38a has been fitted into the housing recessed portion 34g, the flange portion 38b abuts against the peripheral end surface of the outward-facing opening portion of the housing main body portion 34B.

The second connection portion 40 has a configuration similar to the first connection portion 30.

Due to the first connection portion 30 being electrically and mechanically connected to the one electrical device 10, and the second connection portion 40 being electrically and mechanically connected to the other electrical device 14, the electrical wires 22 are also held in a predetermined parallel state between the electrical devices 10 and 14.

Electromagnetic Shield Member

Figure 4:
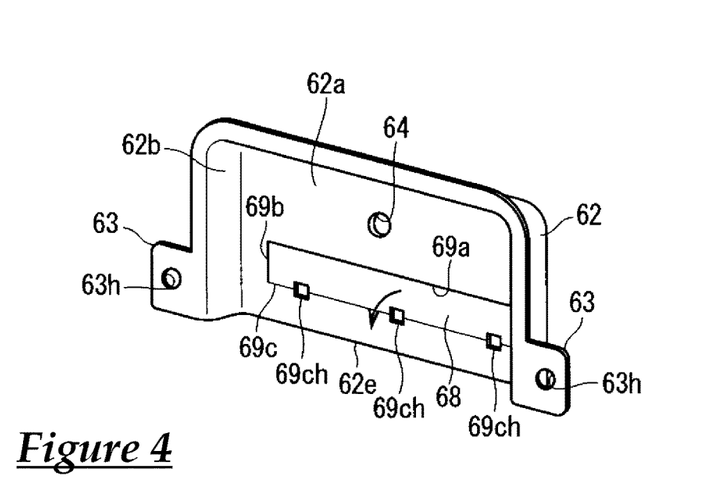
FIG. 4 is a perspective view of a connection portion electromagnetic shield cover.
Figure 5:
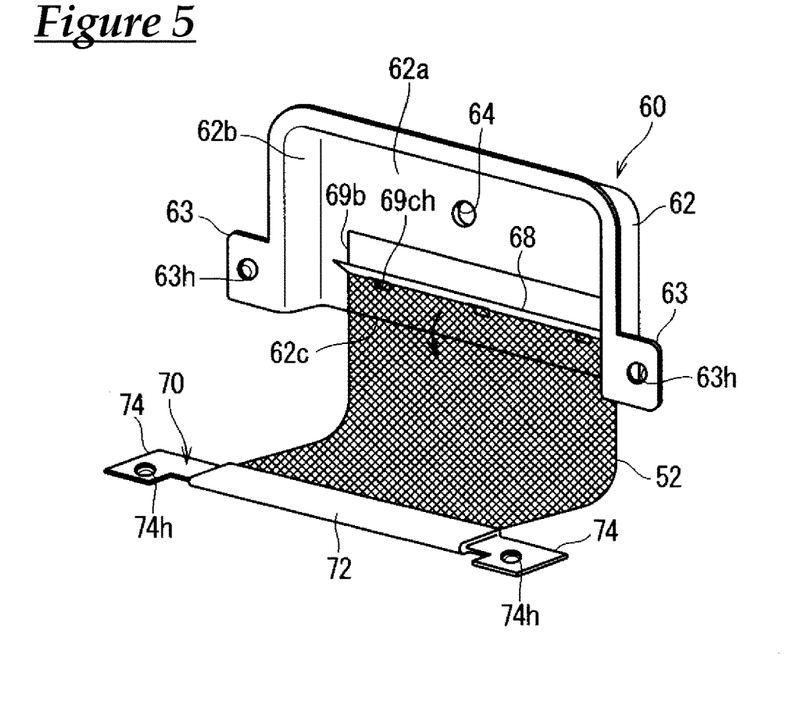
FIG. 5 is an illustrative diagram showing steps for sandwiching and fixing a wiring electromagnetic shield portion to the connection portion electromagnetic shield cover.

FIG. 4 is a perspective view of the connection portion electromagnetic shield cover 60, and FIG. 5 is an illustrative diagram showing steps for sandwiching and fixing the wiring electromagnetic shield portion 52 to the connection portion electromagnetic shield cover 60.

As shown in FIGS. 1 to 5, the electromagnetic shield member 50 includes a wiring electromagnetic shield portion 52 and a connection portion electromagnetic shield cover 60 that is provided on one end portion of the wiring electromagnetic shield portion 52. Also, here, a bracket 70 is attached to the other end portion of the wiring electromagnetic shield portion 52.

The wiring electromagnetic shield portion 52 is a member for electromagnetically shielding the electrical wires 22 between the first connection portion 30 and the second connection portion 40. Here, the wiring electromagnetic shield portion 52 is arranged on the first main surface side (i.e., when envisioning a surface along which the electrical wires 22 extend, a first side of that surface) in the parallel state of the electrical wires 22.

The wiring electromagnetic shield portion 52 is sheet-shaped or plate-shaped. Here, the wiring electromagnetic shield portion 52 is formed by a member obtained by braiding metal strands (e.g., a braided tube, a metal mesh, or a metallic cloth), or by a member obtained by braiding metal strands and resin strands. The wiring electromagnetic shield portion 52 has a shape of spreading out in a quadrangular shape.

The connection portion electromagnetic shield cover 60 is a member formed by performing press work or the like on a metal plate made of copper, a copper alloy, aluminum, an aluminum alloy, or the like, and includes a cover main body portion 62 and a fixing piece 68.

The cover main body portion 62 is shaped so as to cover the first connection portion 30. Here, the cover main body portion 62 includes a main plate portion 62a and a peripheral wall portion 62b. The main plate portion 62a is shaped as a plate that covers the portion of the first connection portion 30 on the side opposite to the casing 11, and the peripheral wall portion 62b is shaped so as to cover three sides of the first connection portion 30 other than the portion in which the electrical wire guide portions 35 extend. The cover main body portion 62 may be formed by performing drawing work on a metal plate member, or may be formed by performing bending work on a metal plate member.

Also, a through-hole 64h is formed in the central portion of the main plate portion 62a of the cover main body portion 62. A screw 64 is inserted into the through-hole 64h and screwed into a screw hole 38g of the first cap 38. Accordingly, the shield cover 60 and the first cap 38 are fixed by the screw 64 or the like (see FIG. 3).

The edge portion of the peripheral wall portion 62b is bent outward, and therefore the peripheral wall portion 62b can stably come into contact with the casing 11 over the largest area possible.

Also, screw fixing pieces 63 are provided protruding from two end portions of the cover main body portion 62. Screw insertion holes 63h are formed in the screw fixing pieces 63, and when the cover main body portion 62 covers the first connection portion 30, the peripheral wall portion 62b of the cover main body portion 62 comes into contact with the outer surface of the casing 11 around the first connection portion 30. By screwing screws into the screw insertion holes 63h and screwing them into screw holes formed in the casing 11 in this state, the connection portion electromagnetic shield cover 60 is fixed to the casing 11.

The depth dimension of the cover main body portion 62 (i.e., the protruding dimension of the peripheral wall portion 62b relative to the main plate portion 62a) is set equal to the height dimension of the portion of the first connection portion 30 that protrudes from the casing 11. Accordingly, when the first connection portion 30 is fixed to the casing 11, by fixing the connection portion electromagnetic shield cover 60 to the casing 11, the main plate portion 62a of the cover main body portion 62 presses the first cap 38 toward the casing 11, thus maintaining the state where the first cap 38 is fitted into the first housing 34.

The fixing piece 68 is deformed so as to extend from the main plate portion 62a of the cover main body portion 62 and then fold backward, and therefore a first-end edge portion of the wiring electromagnetic shield portion 52 is sandwiched and fixed between the fixing piece 68 and the cover main body portion 62.

More specifically, the fixing piece 68 is formed by a portion of the main plate portion 62a, which is in the vicinity of an edge portion 62e where the peripheral wall portion 62b is not formed, being cut along a line 69a that extends along the edge portion 62e and a pair of lines 69b that extend from the two end portions of the line 69a toward the edge portion 62e, and then that portion being bent so as to fold back along a folding line 69c that connects the leading ends of the pair of lines 69b (see FIG. 4). The folding line 69c is a line that is located at the boundary between the cover main body portion 62 and the fixing piece 68.

The fixing piece 68 is folded back midway along the folding line 69c. The edge portion of the wiring electromagnetic shield portion 52 is arranged along the folding line 69c, and then the fixing piece 68 is bent even more (see FIG. 5). Accordingly, the edge portion of the wiring electromagnetic shield portion 52 is sandwiched and fixed (i.e., crimped and fixed) between the cover main body portion 62 and the fixing piece 68 (see FIGS. 2 and 3).

Note that here, check openings 69ch are formed in portions along the folding line 69c. For this reason, by checking visually or the like whether or not the edge portion of the wiring electromagnetic shield portion 52 can be observed through the check openings 69ch, it is possible to check whether or not the edge portion of the wiring electromagnetic shield portion 52 is arranged at a deep position in the vicinity of the folding line 69c after being placed in the gap between the fixing piece 68 and the cover main body portion 62 and crimped and fixed therebetween.

Note that although the fixing piece 68 is bent toward the inward surface of the cover main body portion 62 in this configuration, the fixing piece 68 may be bent toward the outward surface of the cover main body portion 62.

Also, here, the fixing piece 68 is bent at the folding line 69c so as to be folded back to the side on which the wiring electromagnetic shield portion 52 extends. For this reason, it is unlikely for the edge portion of the fixing piece 68 and the wiring electromagnetic shield portion 52 to come into contact with a large force.

Note that it is preferable that the edge portions of the fixing piece 68 and the main plate portion 62a that sandwich the wiring electromagnetic shield portion 52 are bent in a direction away from the wiring electromagnetic shield portion 52 (see FIG. 3).

Also, it is preferable that the fixing piece 68 does not protrude beyond the edge portion 62e of the main plate portion 62a. This is because if the fixing piece protrudes beyond the edge portion of the main plate portion, the portion of the fixing piece that protrudes beyond the main plate portion will come into contact with the shield member when the fixing piece is crimped, and the shield member itself will consequently become deformed a large amount.

The bracket 70 is fixed by being crimped to the edge portion of the wiring electromagnetic shield portion 52 on the side opposite to the connection portion electromagnetic shield cover 60.

The bracket 70 is a member formed by performing press work or the like on a metal plate member, and includes a crimp portion 72 that crimps and fixes an edge portion of the wiring electromagnetic shield portion 52, and fixing pieces 74 that are provided on respective end portions of the crimp portion 72. A screw insertion hole 74h is formed in each of the fixing pieces 74. The bracket 70 is fixed to the casing 15 of the electrical device 14 by screw fastening or the like.

As described above, the edge portion on one side of the wiring electromagnetic shield portion 52 is fixed to the one electrical device 10 by the connection portion electromagnetic shield cover 60, and the edge portion on the other side of the wiring electromagnetic shield portion 52 is fixed to the other electrical device 14 by the bracket 70, and thus the wiring electromagnetic shield portion 52 is supported in a state of covering the first main surface side of the arrangement state of the electrical wires 22 (outer side of the bent route). Also, the wiring electromagnetic shield portion 52 is grounded to the casings 11 and 15 through the connection portion electromagnetic shield cover 60 and the bracket 70.

According to the electromagnetic shield member-equipped wiring device 20 and the electromagnetic shield member 50 configured as described above, an edge portion of the wiring electromagnetic shield portion 52 is sandwiched and fixed between the fixing piece 68 and the cover main body portion 62 of the connection portion electromagnetic shield cover 60. For this reason, the configuration for electromagnetically shielding the first connection portion 30 and the configuration for fixing one edge portion of the wiring electromagnetic shield portion 52 can both be achieved by the connection portion electromagnetic shield cover 60, thus making it possible to electromagnetically shield the electrical wires 22 and the first connection portion at the end portions thereof with the smallest number of components possible.

Also, the fixing piece 68 is folded back to the side on which the wiring electromagnetic shield portion 52 extends, and therefore it is possible for the wiring electromagnetic shield portion 52 to electromagnetically shield the electrical wires 22 while extending toward the other electrical device 14 without being folded back. For this reason, the wiring electromagnetic shield portion 52 is not likely to become damaged.

Also, the wiring electromagnetic shield portion 52 is obtained by braiding metal strands, and thus bends easily. For this reason, it is possible to easily perform the operation of attachment to the connection portion electromagnetic shield cover 60 and the bracket 70 while changing and adjusting the position relative to the connection portion electromagnetic shield cover 60 and the bracket 70. There is also an advantage in that vibration is not likely to be transmitted between the electrical devices 10 and 14.

Also, the connection portion electromagnetic shield cover 60 presses the first cap 38 of the first connection portion 30 toward the electrical device 10, thus making it possible to suppress detachment of the first cap 38.

Variations

The following describes variations that are premised on the above embodiment.

Figure 6:
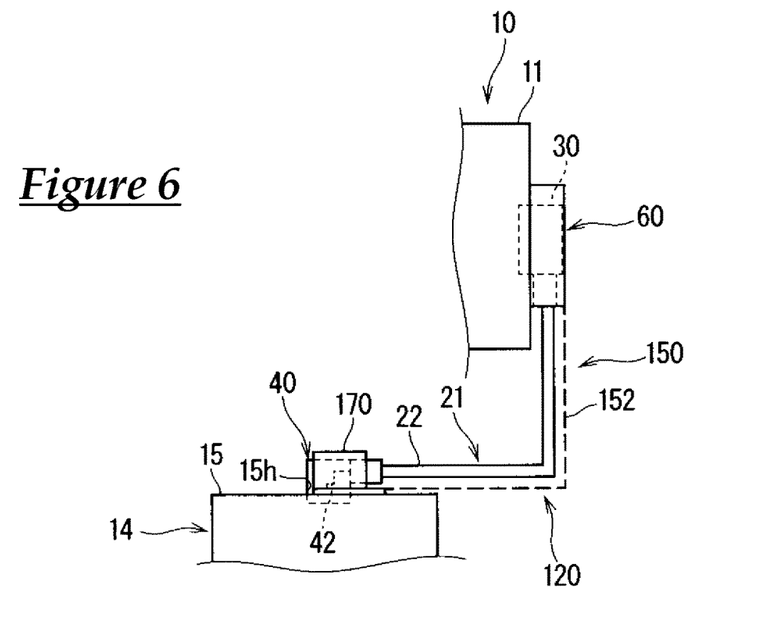
FIG. 6 is an illustrative diagram showing a state where an electromagnetic shield member-equipped wiring device according to a first variation is used as wiring between two electrical devices.
Figure 7:
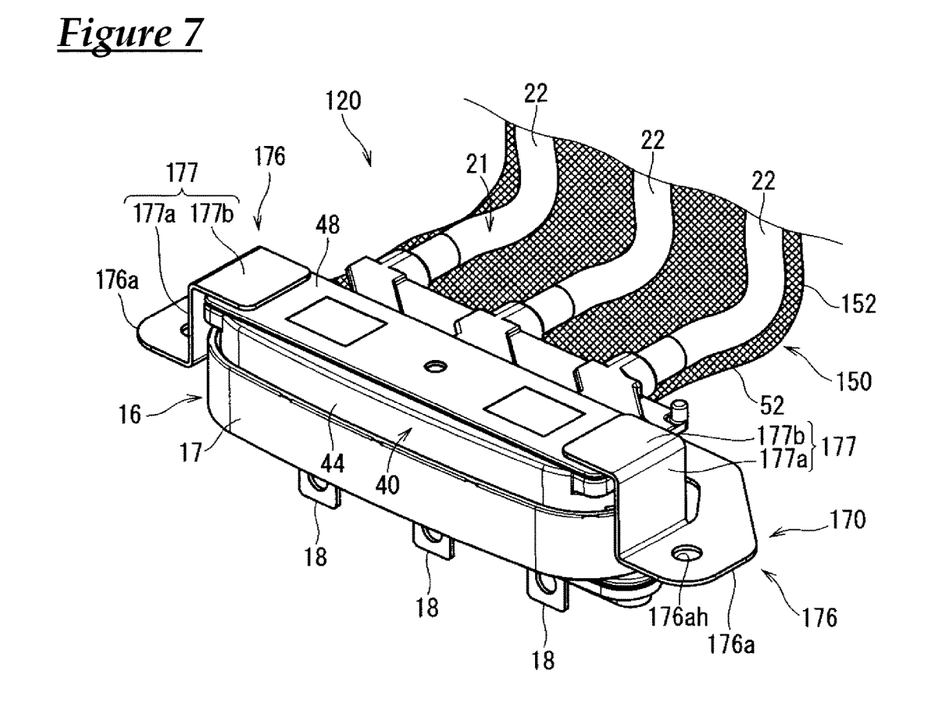
FIG. 7 is a perspective view showing a state where a bracket according to the first variation presses a second connection portion.
Figure 8:
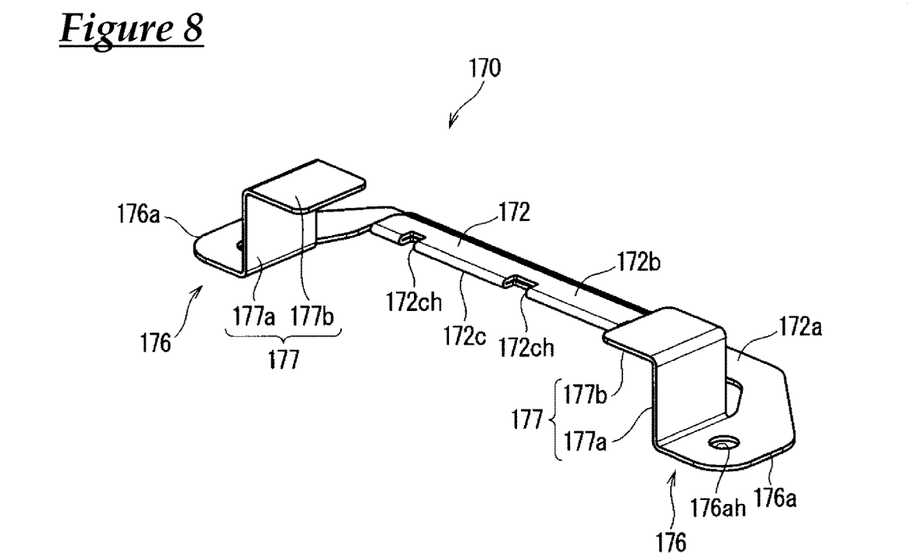
FIG. 8 is a perspective view showing the aforementioned bracket.

FIG. 6 is an illustrative diagram showing a state where an electromagnetic shield member-equipped wiring device 120 according to a first variation is used as wiring between two electrical devices 10 and 14. FIG. 7 is a perspective view of a state where a bracket 170 according to the first variation presses a second connection portion 40, and FIG. 8 is a perspective view of the bracket 170.

A variation regarding the bracket 170 is mainly described in the first variation.

A wiring device 21 is similar to the wiring device described in the above embodiment. In FIG. 7, the second connection portion 40 is illustrated more specifically, and the state where the second connection portion 40 is connected to a terminal block 16 provided on the second electrical device 14 is illustrated.

Here, the terminal block 16 includes a terminal block housing 17 that is attached to the casing 15 of the second electrical device 14, and multiple device terminals 18 that are provided inside the terminal block housing 17.

The terminal block housing 17 is a member that is formed by a resin or the like, and is shaped as an elongated cylinder. The terminal block housing 17 is attached to the casing 15 so as to surround an outer portion of an elongated opening formed in the casing 15.

The device terminals 18 are conductive plate members formed by metal plates or the like, and are L-shaped here. When the device terminals 18 are connected to an electrical element of the second electrical device 14 (motor winding or the like), they are held in a certain orientation via holding members or the like that are attached to the casing 15.

Also, the second connection portion 40 includes second terminals 42, a second housing 44 and a second cap 48.

The second terminals 42 have a configuration similar to the first terminals 32, and are connected to second end portions of the electrical wires 22 (see FIG. 6).

The second housing 44 is shaped as an elongated cylinder that is elongated in the width direction, and the device connection portions of the second terminals are arranged in an housing recessed portion inside the second housing 44. The second terminals 42 are supported by the second housing 44 in a parallel state with spaces between each other. The second housing 44 is configured such that the terminal block housing 17 can be fitted therein. When the second housing 44 is fitted in and connected to the terminal block housing 17, end portions of the device terminals 18 and the device connection portions of the second terminals 42 are overlaid on each other. In this state, the connection portions between the end portions of the device terminals 18 and the device connection portions of the second terminals 42 are exposed to the outside through an outward-facing opening of the second housing 44, and screws or the like are used to perform an operation of connecting the end portions of the device terminals 18 to the device connection portions of the second terminals 42 through this opening.

The second cap 48 blocks the housing recessed portion of the second housing 44 from the side opposite to the casing 15. Here, similarly to the first cap 38, the second cap 48 includes a portion that is to be fitted into the housing recessed portion, and a flange portion that protrudes circumferentially outward from this fitting portion of the second housing 44.

In this variation, the wiring electromagnetic shield portion 52 is arranged on the first main surface side in the parallel arrangement state of the electrical wires 22.

Also, the first connection portion 30 is connected to the electrical device 10 on a second main surface side (left side in FIG. 6) in the parallel arrangement state of the electrical wires 22. For this reason, the connection portion electromagnetic shield cover 60 covers the first connection portion 30 from the side opposite to the electrical device 10, that is to say the first main surface side in the parallel arrangement state of the electrical wires 22. For this reason, the wiring electromagnetic shield portion 52 and the connection portion electromagnetic shield cover 60 are arranged on the same side relative to the electrical wires 22. Accordingly, as described in the above embodiment, it is possible to easily realize a configuration in which one edge portion of the wiring electromagnetic shield portion 52 is sandwiched and fixed by the connection portion electromagnetic shield cover 60.

On the other hand, the second connection portion 40 is connected to the other electrical device 14 on the first main surface side (lower side in FIG. 6) in the arrangement state of the electrical wires 22. For this reason, the portion that presses the second cap 48 in the second connection portion 40 and the wiring electromagnetic shield portion 52 are arranged on opposite sides relative to the electrical wires 22. Accordingly, it is difficult for the configuration pertaining to the connection portion electromagnetic shield cover 60 described in the above embodiment to be applied as-is.

In view of this, in the present variation, the bracket 170 described below is used.

Specifically, the bracket 170 is a member formed by performing press work or the like on a metal plate made of copper, a copper alloy aluminum, an aluminum alloy, or the like, includes an electromagnetic shield member fixing portion 172, and cap pressing portions 176, and is configured to be able to be fixed to the casing 15.

The electromagnetic shield member fixing portion 172 has a configuration in which an elongated plate-shaped second sandwiching piece 172*b* is bent via a folding portion 172*c* so as to be overlaid on an elongated plate-shaped first sandwiching piece 172*a*. An edge portion on the other side of the wiring electromagnetic shield portion 52 is sandwiched and fixed between the first sandwiching piece 172*a* and the second sandwiching piece 172*b*. Note that the folding portion 172*c* is provided with check openings 172*ch* for checking whether or not the edge portion of the wiring electromagnetic shield portion 52 is arranged at a deep position between the first sandwiching piece 172*a* and the second sandwiching piece 172*b*.

This electromagnetic shield member fixing portion 172 is arranged along the outer surface of the casing 15 between the casing 15 and the electrical wires 22 that extend from the second connection portion 40.

The cap pressing portions 176 extend from the electromagnetic shield member fixing portion 172 toward the second cap 48 while circumventing sides of the second connection portion 40, and are configured to be able to press the second cap 48.

More specifically, the cap pressing portions 176 include base plate portions 176*a* that extend laterally relative to the second connection portion 40 from the two end portions of the first sandwiching pieces 172*a*, and cover portions 177 that protrude away from the casing 15 from the inward edge portions of the base plate portions 176*a*. The cover portions 177 include side plate portions 177*a* that cover the outer surfaces of two side portions of the second connection portion 40, and ceiling plate portions 177*b* that extend inward from the upper ends of the side plate portions 177*a*.

Screw through-holes 176*ah* are formed in the base plate portion 176*a*, and when the base plate portions 176*a* are arranged on the casing 15, by inserting screws into the screw through-holes 176*ah* and screwing them into screw holes in the casing 15, the bracket 170 is fixed to the casing 15.

The distance between the base plate portions 176*a* and the ceiling plate portions 177*b* is set the same as the protruding dimension of the second connection portion 40 relative to the casing 15. When the second connection portion 40 is attached to the casing 15, by fixing the bracket 170 to the casing 15 as described above, the ceiling plate portions 177*b* of the cap pressing portions 176 abut against the outward-facing surface of the second cap 48 and press the second cap 48 toward the casing 15. Accordingly, the second cap 48 is unlikely to become detached.

In this way, the bracket 170, which fixes the other edge portion of the wiring electromagnetic shield portion 52, can press the second cap 48 as well, thus making it possible to fix the other edge portion of the wiring electromagnetic shield portion 52 and suppress falling of the second cap 48 with an even smaller number of components.

Also, the cap pressing portions 176 are shaped so as to be able to cover the two end portions of the second connection portion 40 to a certain extent (here, a shape capable of covering the upper portion and outer portions of side portions), thus making it possible to expect, to a certain extent, the ability to electromagnetically shield and protect the second connection portion 40.

Note that it is not essential to provide two cap pressing portions 176 in the present variation, and a configuration is possible in which only one is provided.

Figure 9:
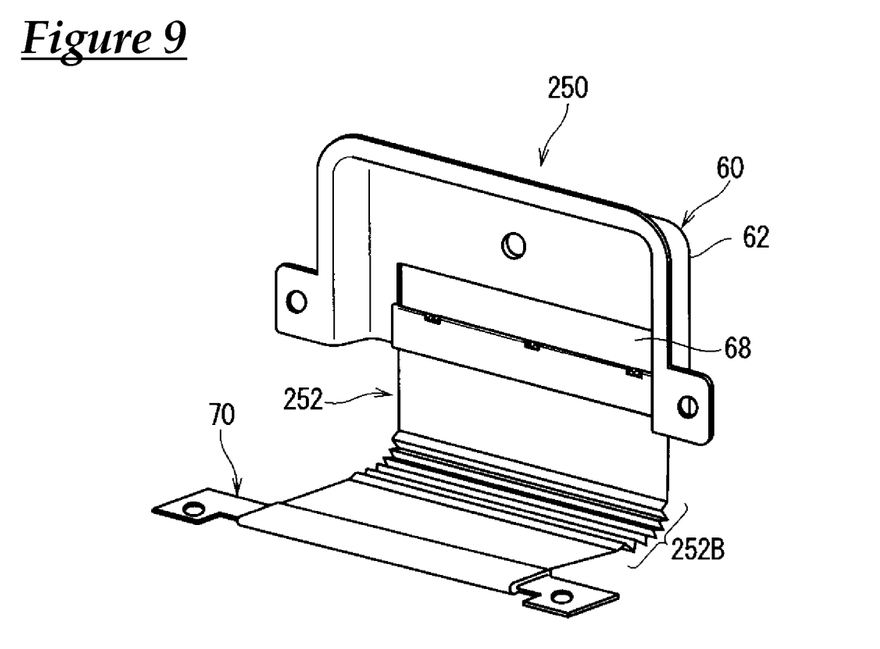
FIG. 9 is a perspective view of an electromagnetic shield member according to a second variation.
Figure 10:
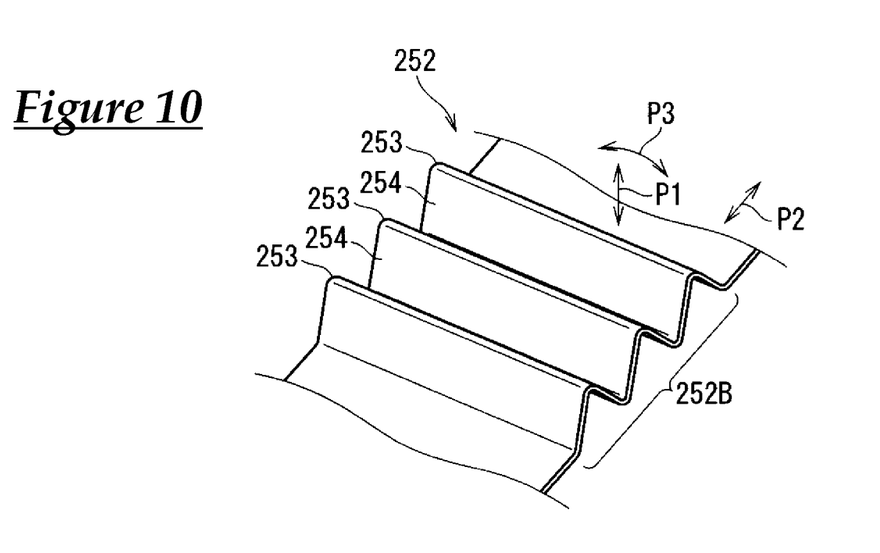
FIG. 10 is a perspective view of a wiring electromagnetic shield portion according to the second variation.

FIG. 9 is a perspective view of an electromagnetic shield member 250 according to a second variation, and FIG. 10 is a perspective view of a wiring electromagnetic shield portion 252 according to the second variation.

In the second variation, an example is described in which a member including a metal plate member folded in a bellows-like manner is used as the wiring electromagnetic shield portion 252.

Specifically, the wiring electromagnetic shield portion 252 includes a bellows-shaped portion 252B due to performing press work or the like on a metal plate that is made of copper, a copper alloy, aluminum, an aluminum alloy, or the like. Here, the bellows-shaped portion 252B is formed in only a portion of the wiring electromagnetic shield portion 252 (particularly, a portion thereof that is bent into an L shape) that is located between a first-side edge portion (edge portion to which the connection portion electromagnetic shield cover 60 is attached) and a second-side edge portion (edge portion to which the bracket 70 is attached). Of course, the entirety of the wiring electromagnetic shield portion may be bellows-shaped.

In the example shown in FIG. 10, in a view from the first main surface of the wiring electromagnetic shield portion 252, the portion 252B includes protruding portions 253 that protrude in the shape of triangular protrusions over the entirety of the width direction of the wiring electromagnetic shield portion 252, and recessed portions 254 that recede in the shape of triangular recessions over the entire width of the wiring electromagnetic shield portion 252, and these protruding portions 253 and recessed portions 254 alternate from one side of the wiring electromagnetic shield portion 252 toward the other end side.

According to this example, the wiring electromagnetic shield portion 252 can easily bend at bent portions at the top of the protruding portions 253 and bent portions at the bottom of the recessed portions 254. For this reason, the wiring electromagnetic shield portion 252 can easily become displaced in a thickness direction P1 and an expansion/contraction direction P2. Also, if different expansion/contraction amounts are set for the protruding portions 253 and the recessed portion 254 in the width direction of the wiring electromagnetic shield portion 252 (e.g., the protruding portions 253 and recessed portion 254 expand on one side in the width direction of the wiring electromagnetic shield portion 252, and the protruding portions 253 and recessed portions 254 contract on the other side), the wiring electromagnetic shield portion 252 can be displaced in a width direction P3 as well. Accordingly, it is possible to easily perform the operation of attachment to the connection portion electromagnetic shield cover 60 and the bracket 70 while changing and adjusting the position relative to the connection portion electromagnetic shield cover 60 and the bracket 70. There is also an advantage in that vibration is not likely to be transmitted between the electrical devices 10 and 14.

Figure 11:
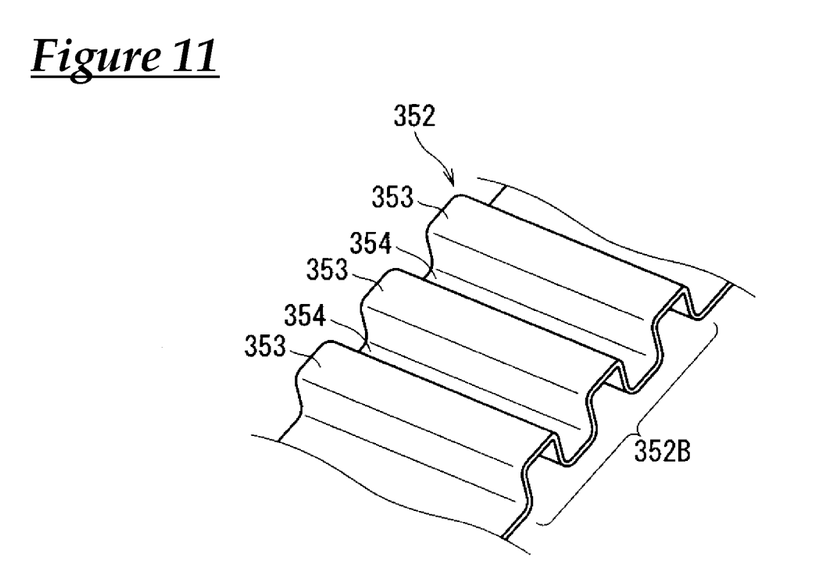
FIG. 11 is a perspective view of a wiring electromagnetic shield portion according to a third variation.

Note that a configuration is possible in which, as in a third variation shown in FIG. 11, a wiring electromagnetic shield portion 352 includes a bellows-shaped portion 352B that includes, in a view from the first main surface of the wiring electromagnetic shield portion 352, protruding portions 353 that protrude in the shape of quadrangular protrusions over the entirety of the width direction of the wiring electromagnetic shield portion 352, and recessed portions 354 that recede in the shape of quadrangular recessions over the entire width of the wiring electromagnetic shield portion 352, and these protruding portions 353 and recessed portions 354 alternate from one side of the wiring electromagnetic shield portion 352 toward the other end side.

In this case as well, it is possible to obtain actions and effects similar to those of the wiring electromagnetic shield portion 252.

Figure 12:
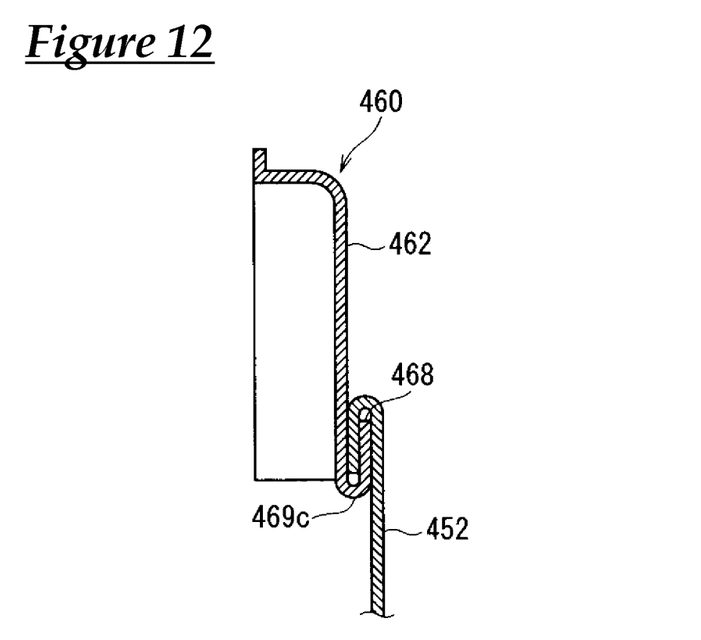
FIG. 12 is a cross-sectional view of a cover according to a fourth variation.

Also, in a connection portion electromagnetic shield cover 460 according to a fourth variation shown in FIG. 12, a fixing piece 468 extends outward from an edge portion of a cover main body portion 462, which corresponds to the cover main body portion 62, on the side on which the electrical wires 22 extend. The fixing piece 468 is folded back along a folding line 469c, which is at the boundary with the cover main body portion 462, so as to be overlaid on either main surface of the cover main body portion 462 (the outward-facing main surface here). Also, an edge portion of a wiring electromagnetic shield portion 452, which corresponds to the wiring electromagnetic shield portion 152, is sandwiched and fixed between the cover main body portion 462 and the fixing piece 468. The wiring electromagnetic shield portion 452 is folded back at a portion extending between the fixing piece 468 and the cover main body portion 462, and is drawn toward the second connection portion.

According to this example, the cover main body portion 462 can cover as much of the entirety of the first connection portion 30 as possible, thus having an advantage of being excellent in terms of electromagnetic shielding performance.

Note that the wiring electromagnetic shield portion may be, for example, a member formed by braiding metal strands as described in the above embodiment. Also, the fixing piece may be folded back to the inward-facing main surface side of the cover main body portion.

Note that the configurations described in the above embodiment and variations can be appropriately combined as long as no contradiction arises.

Although this design has been described in detail above, the above description is illustrative in all respects, and this invention is not limited to the above description. It will be understood that numerous variations not illustrated here can be envisioned without departing from the range of this invention.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

REFERENCE SIGNS LIST

10 First electrical device
14 Second electrical device
20,120 Electromagnetic shield member-equipped wiring device
21 Wiring device
22 Electrical wire
24 Conductive wire
30 First connection portion
32 First terminal
34 First housing
34g Housing recessed portion
38 First cap
40 Second connection portion
42 Second terminal
44 Second housing
48 Second cap
50,250 Electromagnetic shield member
52,152,252,352,452 Wiring electromagnetic shield portion
60,460 Connection portion electromagnetic shield cover
62,462 Cover main body portion
68,468 Fixing piece
69c,469c Folding line
170 Bracket
172 Electromagnetic shield member fixing portion
176 Cap pressing portion
252B,352B Bellows-shaped portion

The invention claimed is:

1. An electromagnetic shield member comprising:
a wiring electromagnetic shield portion that electromagnetically shields a wiring member; and
a connection portion electromagnetic shield cover that is formed by a metal plate member and electromagnetically shields a connection portion of an end portion of the wiring member,
wherein the connection portion electromagnetic shield cover includes a cover main body portion that covers the connection portion of the end portion of the wiring member, and a fixing piece that sandwiches and fixes a first-end edge portion of the wiring electromagnetic shield portion by extending from the cover main body portion and being bent so as to fold back and to fix the first-end edge portion of the wiring electromagnetic shield portion between the cover main body portion and the fixing piece, the fixing piece being formed from the metal plate member at a portion of the cover main body portion.

2. The electromagnetic shield member according to claim 1, wherein the fixing piece is folded back toward a side on which the wiring electromagnetic shield portion extends, at a folding line located at a boundary with the cover main body portion.

3. The electromagnetic shield member according to claim 1, wherein the wiring electromagnetic shield portion is obtained by braiding metal strands.

4. The electromagnetic shield member according to claim 1, wherein the wiring electromagnetic shield portion includes a portion in which a metal plate is folded into a bellows shape.

5. An electromagnetic shield member-equipped wiring device comprising;
a wiring device that includes a wiring member, a first connection portion that is provided at a first end portion of the wiring member and is to be connected to a first electrical device, and a second connection portion that is provided at a second end portion of the wiring member and is to be connected to a second electrical device; and
the electromagnetic shield member according to claim 1, the connection portion electromagnetic shield cover electromagnetically shielding the first connection portion.

6. The electromagnetic shield member-equipped wiring device according to claim 5,
wherein the first connection portion includes a first terminal provided at the first end portion of the wiring member, a first housing that forms a housing recessed portion in which the first terminal is housed, and a first cap that blocks the housing recessed portion, and
the connection portion electromagnetic shield cover is to be attached to a casing of the first electrical device in a state of pressing the first cap.

7. The electromagnetic shield member-equipped wiring device according to claim 5,
including a plurality of the wiring members that are arranged in a parallel state,
wherein the wiring electromagnetic shield portion is arranged on a first main surface side of the parallel state of the plurality of wiring members,
the first connection portion is to be connected to the first electrical device on a second main surface side in the parallel state of the plurality of wiring members,
the connection portion electromagnetic shield cover electromagnetically shields the first connection portion from the first main surface side in the parallel state of the plurality of wiring members,
the second connection portion includes a second terminal provided at the second end portion of the wiring member, a second housing that forms a housing recessed portion in which the second terminal is housed, and a second cap that blocks the housing recessed portion of the second housing, and the second connection portion is to be connected to the second electrical device on the first main surface side in an arrangement state of the plurality of wiring members, and
the electromagnetic shield member-equipped wiring device comprises a bracket that is to be fixed to a casing of the second electrical device, the bracket including an electromagnetic shield member fixing portion fixed to an edge portion on a second end side of the wiring electromagnetic shield portion, and a cap pressing portion that extends from the electromagnetic shield member fixing portion toward the second cap while circumventing a side of the second connection portion and that presses the second cap.

* * * * *